United States Patent
Logan et al.

(10) Patent No.: US 9,420,733 B2
(45) Date of Patent: Aug. 16, 2016

(54) ELECTROMAGNETIC PULSE PROTECTED HARD DRIVE

(71) Applicant: Twin Harbor Labs, LLC, Plano, TX (US)

(72) Inventors: James D Logan, Candia, NH (US); Garrett Malagodi, Durham, NH (US); Richard A Baker, Jr., West Newbury, MA (US); David Lentini, North Berwick, ME (US)

(73) Assignee: Twin Harbor Labs, LLC, Plano, TX (US)

( * ) Notice: Subject to any disclaimer, the term of this patent is extended or adjusted under 35 U.S.C. 154(b) by 0 days.

(21) Appl. No.: 14/880,760

(22) Filed: Oct. 12, 2015

(65) Prior Publication Data

US 2016/0120075 A1    Apr. 28, 2016

Related U.S. Application Data

(60) Provisional application No. 62/062,999, filed on Oct. 13, 2014.

(51) Int. Cl.
*G11B 33/14* (2006.01)
*H05K 9/00* (2006.01)

(52) U.S. Cl.
CPC .......... *H05K 9/0007* (2013.01); *G11B 33/1493* (2013.01)

(58) Field of Classification Search
None
See application file for complete search history.

(56) References Cited

U.S. PATENT DOCUMENTS

| | | | | |
|---|---|---|---|---|
| 4,895,426 A * | 1/1990 | Pinson | ...................... | F41G 7/32 174/70 R |
| 5,136,295 A * | 8/1992 | Bull | .......................... | G01S 7/38 342/15 |
| 6,018,125 A | 1/2000 | Collins et al. | | |
| 6,292,373 B1 | 9/2001 | Li et al. | | |
| 6,659,655 B2 * | 12/2003 | Dair | ...................... | G02B 6/4292 385/92 |
| 6,791,841 B1 * | 9/2004 | Tirrell | ................... | H05K 5/0247 361/724 |
| 7,274,851 B2 * | 9/2007 | Morris | ................. | G02B 6/4201 312/236 |
| 7,342,184 B2 * | 3/2008 | Cochrane | ............. | H05K 9/0073 174/366 |
| 8,004,791 B2 | 8/2011 | Szeremeta et al. | | |
| 8,289,717 B2 * | 10/2012 | Heimann | ................. | H04Q 1/10 174/382 |
| 8,547,710 B2 * | 10/2013 | Ruehl | ................... | H05K 7/1497 361/816 |
| 8,599,576 B2 | 12/2013 | Faxvog et al. | | |
| 8,643,772 B2 | 2/2014 | Anderson | | |
| 8,655,939 B2 | 2/2014 | Redlich et al. | | |
| 8,754,980 B2 * | 6/2014 | Anderson | .............. | G03B 17/02 348/373 |

(Continued)

FOREIGN PATENT DOCUMENTS

WO    2012047734 A2    4/2012

OTHER PUBLICATIONS

Chisholm, Patrick, "Protect our electronics against EMP attack", Christian Science Monitor, Dec. 19, 2005.

(Continued)

*Primary Examiner* — Brian Miller
(74) *Attorney, Agent, or Firm* — Richard A. Baker (57) ABSTRACT

A computer storage system protected from electromagnetic pulses is described. The storage system utilizes either a hard drive or a solid state drive to hold the data. The device uses fiber optics to transfer data and is powered by either a Power over Fiber system or by a switched battery system. The device protects against radiation, magnetic pulses, and electronic pulses using an enclosure that incorporates a faraday cage, a radiation shield, and/or a magnetic shield.

20 Claims, 5 Drawing Sheets

(56) References Cited

U.S. PATENT DOCUMENTS

| | | | | | |
|---|---|---|---|---|---|
| 8,760,859 | B2* | 6/2014 | Fuchs | ............... | G06F 1/1656 174/383 |
| 8,849,595 | B2* | 9/2014 | Manto | ............... | H05K 7/1497 702/57 |
| 8,933,393 | B2* | 1/2015 | Anderson | ............... | G02B 6/06 250/214.1 |
| 8,987,925 | B2* | 3/2015 | McCarthy | ............... | F02B 63/04 290/1 B |
| 2005/0084033 | A1* | 4/2005 | Rosen | ............... | H04L 27/2601 375/295 |
| 2006/0272857 | A1* | 12/2006 | Arnold | ............... | H05K 9/0024 174/377 |
| 2007/0105445 | A1* | 5/2007 | Manto | ............... | H05K 7/1497 439/620.09 |
| 2009/0244876 | A1* | 10/2009 | Li | ............... | H05K 9/0032 361/818 |
| 2010/0128455 | A1* | 5/2010 | Ophoven | ............... | H04N 5/2252 361/818 |
| 2010/0208433 | A1* | 8/2010 | Heimann | ............... | H04Q 1/10 361/724 |
| 2010/0315792 | A1* | 12/2010 | Jones | ............... | H05K 5/0021 361/753 |
| 2011/0088940 | A1 | 4/2011 | Nordling et al. | | |
| 2011/0222249 | A1 | 9/2011 | Ruehl et al. | | |
| 2011/0267765 | A1* | 11/2011 | Fuchs | ............... | G06F 1/182 361/679.33 |
| 2014/0046167 | A1* | 2/2014 | Vij | ............... | A61B 5/7475 600/410 |

OTHER PUBLICATIONS

Knutsdottir, Vera, "Improvised Electromagnetic Pulse Devices—Weapons Effects and Countermeasures", DefenseMediaNetwork, Nov. 7, 2011.

Radasky, William, "Electromagnetic Warfare is Here", IEEE Spectrum, Aug. 25, 2014.

Thibodeau, Patrick, "New data center protects against solar storms and nuclear EMPs", Computerworld, Sep. 15, 2014.

* cited by examiner

ELECTROMAGNETIC PULSE PROTECTED HARD DRIVE

RELATED APPLICATIONS

This patent application is a non-provisional application of, and claims the benefit of the filing dates of, U.S. Provisional Patent No. 62/062,999 filed on Oct. 13, 2014 entitled Electromagnetic Pulse Protected Hard Drive. The disclosures of this provisional patent application is incorporated herein by reference.

BACKGROUND OF INVENTION

1. Field of the Invention

The present invention is directed to computer storage devices and is more specifically related to rotating or solid state drives that are hardened to withstand electromagnetic pulses.

2. Description of the Related Art

Since the Manhattan project in the 1940s, governments and businesses have been worried about the effects of nuclear explosions on electronics. At first, the concern was limited to the damage cause by blast and radiation. Later, however, as microelectronics (e.g., transistor-based) technologies began to dominate military and civilian use over vacuum tube-based electronics (vacuum tubes being more resistant to EMP effects), the concern expanded to include a phenomenon called "electromagnetic pulse" ("EMP"). Hundreds of millions of dollars were spent by the US Government on nuclear tests in the 1950s and 1960s to determine the characteristics of electromagnetic pulses on various military aviation and weapons systems. Shielding was designed and equipment modified to avoid damage from a nuclear event. But this work addressed military requirements and not the needs of the private sector.

Generally, EMP protections are implemented at the "site" level, along with construction and design to protect a site from nuclear blast and radiation. Data centers are included among such sites, and there are numerous data center designs that are EMP protected. However, like most military implementations, these data centers are designed to generate power from within, so that EMP damage through the power lines can be eliminated. This solution is quite expensive, and not useful for personal computers. However, given the concerns over nuclear proliferation and the possibility of a terrorist nuclear attack, the interest in providing protection for critical data for non-military uses has become acute.

Most personal computer owners who attempt to address EMP risks use uninterruptable power supply ("UPS") systems such as the Schneider Electric APC BACK-UPS PRO line of uninterruptable power supplies. These UPS systems include surge protection to block EMP impact on the connected devices. However, this APC UPS and most other surge protection devices protect against a relatively low number of joules (hundreds of joules) whereas a lightning strike or other EMP event could produce 5 billion joules of energy or more. With this amount of energy, the electricity could easily jump through all wires within the UPS, causing energy to follow to the connected devices.

The other option for the personal computer owner is to disconnect the hard drive by operating the computer wirelessly and with a battery. The disadvantages of this solution is that eventually the battery needs to be recharged, opening the system to EMP risk during the recharging.

The present invention eliminates the issues articulated above as well as other issues with the currently known products.

SUMMARY OF THE INVENTION

One aspect of the present invention takes the form of a data storage device designed to protect against EMP events through the incorporation of a fiber optics data cable threaded through a small serpentine hole in an EMP enclosure. A second small serpentine hole contains a light pipe for transmitting power over fiber to the inside of the EMP enclosure. The EMP enclosure incorporates one or more of a faraday cage, a lead radiation shield, and a steel magnetic shield. The data storage device could be a solid state hard drive or a rotating media hard drive.

Another aspect of this invention takes the form of a data storage device designed to protect against EMP events through the incorporation of a fiber optics data cable threaded through a serpentine hole in an EMP enclosure. Power is delivered to the data storage device through a dual battery device that is switched between a charging state connected to the outside of the EMP enclosure and directly connected to power the storage device. The EMP enclosure incorporates one or more of a faraday cage, a lead radiation shield, and a steel magnetic shield. The data storage device could be a solid state hard drive or a rotating media hard drive.

DETAILED DESCRIPTION OF THE INVENTION

This invention allows for an EMP Protected Hard Drive to be actively used without the fear of corrupted or lost data. Most electronic devices would not survive an EMP event. Electronic devices that could survive an EMP event often require special off-line storage containers. The EMP Protected Hard Drive provides unique safety features never before seen in a hard drive, while operating efficiently and consistently.

The EMP Protected Hard Drive protects a rotating or solid state hard drive, or other similar electronic device, against an Electromagnetic Pulse (EMP) that could otherwise prove damaging. The invention consists of a faraday cage surrounding the hard drive, a power source capable of withstanding extreme power surges, and a fiber optics cable for transporting data to and from a processor. The hard drive is designed to endure the effects of an electromagnetic pulse from boosted electrical charges traveling through the power lines and electronic current radiating through the air; both of which are the main effects of an EMP strike. Some examples of an EMP strike are nuclear explosions, lightning strikes, and voltage spikes. In such situations, vital data stored on the EMP Protected Hard Drive would be safe and uncorrupted.

A faraday cage is a well-known enclosure designed to shield its product from airborne electromagnetic pulses. The cage does not, however, allow a user to interact with or power these devices. This invention is designed with the ability to actively use the hard drive while remaining protected from an EMP strike. Strikes occur extremely quickly and can vary greatly in magnitude. It is vital that The EMP Protected Hard Drive is designed to survive the most severe of situations, a close range EMP explosive, but it can also protect against other electronic surge situations.

While the discussions here discuss the protection of a hard drive, it is envisioned that one of ordinary skill in the art could incorporate other computer components in the EMP enclosure. For instance, the entire computer could be placed within the EMP enclosure, or certain parts of the computer could be included inside of the EMP enclosure. For instance, an entire laptop could be placed within the EMP enclosure with USB ports sent through the enclosure to attach to a keyboard, a mouse, and a screen.

The Problem

Hard drives contain data that, in some situations, is tremendously important to a user. Whether it is financial, sentimental, or essential information, it needs to be safe and accessible at all times. All hard drives, like most electronic devices, are vulnerable to EMPs and electrical spikes that could corrupt the data and/or destroy the hardware. It is difficult to protect hard drives against such electric events because of the events unpredictable and instantaneous nature. EMP ignitions, lightning strikes, and voltage spikes are all capable of destroying electrical equipment in a matter of milliseconds.

In addition, the electronics necessary to operate the hard drive must be available after an EMP event. Designing a system that allows the data to survive but not the access circuitry will not solve the problem, so any circuitry outside of the EMP enclosure needs to be readily replaceable.

Faraday Cage

Figure 3:
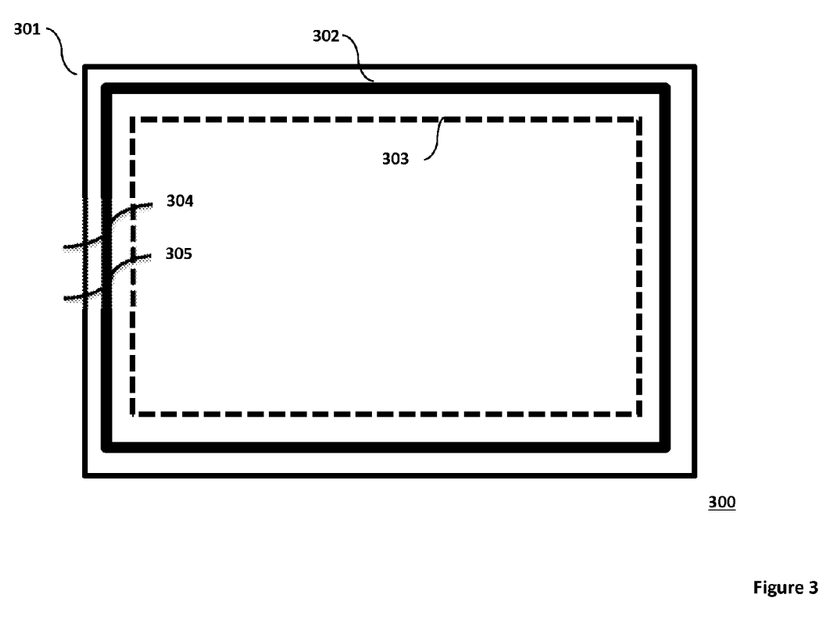
FIG. 3 is a diagram of the layers of the EMP enclosure, showing the relationship between the faraday cage, the lead shield and the steel enclosure.

FIG. 3 has a drawing of the EMP enclosure 300, which includes a faraday cage 303, a lead shield 302 and a steel cover 301. A faraday cage 303 is a grounded metal enclosure designed to reroute potentially damaging electrostatic and electromagnetic fields away from the contents of the cage 303. It does this by distributing constant voltage around the cage 303, preventing current from flowing through the interior. This is best done with a good conductive material. For example, a copper meshing 303 of suitable thickness could surround the hard drive. The copper's thickness can vary, but the copper's width must be sufficient to surround the hard drive. A thickness of the copper of 15 mils is preferred. The cage 303 does not muffle the electromagnetic field but simply redirects the energy. For this reason, the cage 303 also does not need to be a solid piece of copper. Copper chicken wire is a great example of the material necessary to create an appropriate faraday cage 303. The mesh style cage will still distribute the current around the cage 303 to the ground, keeping the hard drive safe. In one embodiment, the EMP Protected Hard Dive would be almost completely surrounded by a faraday cage 303. The only opening being a small hole for the power source 304 and the data transfer cables 305. How the small opening allows for safe interaction is important and will be discussed in greater detail later on.

An EMP event could occur in the aftermath of a nuclear explosion. During such an event, radiation would prove to be another danger to electronic devices. The bomb could create magnetic radiation and nuclear radiation; both potential threats to a hard drive. To protect against nuclear radiation, a lead layer 302 of suitable thickness could be added surrounding the cage 303. A thickness of 600 mils is preferred. Other materials that could replace the lead include concrete, tantalum, steel, or tin. To protect against magnetic radiation, a layer of steel 301, preferably hot rolled steel, of suitable thickness would be added. Iron or other materials could replace the steel to protect against the magnetic radiation. A thickness of 20 mils is preferred. This means the EMP Protected Hard Drive, in one embodiment, will be enclosed in three layers; a layer of copper mesh 303, then a layer of lead 302, and finally an outer layer of steel 301. Such an enclosure would protect the valuable information stored on the hard drive from almost any form of global attack or surge of energy. It would protect against everything from a localized lightning surge to an atomic bomb or solar flare. Without such an enclosure, in the event of a strike, all the electrical components in the hard drive could be destroyed; even if the hard drive was off and not in use.

In order to protect against an electromechanical pulse from a 20 Megaton through a 1 Kiloton atomic bomb blast, a design that incorporates a 15 mil copper thickness layer inside of a 600 mil lead layer inside of a 20 mil hot rolled steel layer is preferred. This will handle both a high (defined as greater than 19 miles), a medium, and a low altitude EMP pulse. Calculated for protection against the following environments. With a high altitude event, this design covers gamma and neutron radiation. This design covers medium altitude and surface events with the following approximate slant range (distance) vs yield.

| Yield, MT | Distance, ft | Distance, Km |
| --- | --- | --- |
| 20.000 | 9256 | 2.8 |
| 1.000 | 7441 | 2.3 |
| 0.500 | 7030 | 2.1 |
| 0.200 | 6493 | 2.0 |
| 0.100 | 6090 | 1.9 |
| 0.050 | 5696 | 1.7 |
| 0.020 | 5181 | 1.6 |
| 0.001 | 3593 | 1.1 |

For further information on the design of EMP enclosures, see A Review of Nuclear Explosion Phenomena Pertinent to Protective Construction by H. L. Brode and EMI Shielding Theory & Gasket Design Guide by Chomerics, Inc., incorporated herein by reference.

The EMP enclosure 300 for the EMP Protected Hard Drive could be designed in one of two ways. In the event that two batteries are used in order to power the EMP Protected Hard Drive, the EMP enclosure 300 would require two different enclosed areas; one area for the hard drive and one area for the capacitor and batteries (see FIG. 1). The barrier between the hard drive and batteries 109 help guard against physical damage to the hard drive in the event the batteries ignite or burst. A voltage spike has the potential to over flow the batteries with energy, causing them to heat up and rupture. The physical barrier 109 can be made from the same materials as the rest of the cage 108 or a different but otherwise suitable material.

Figure 2:
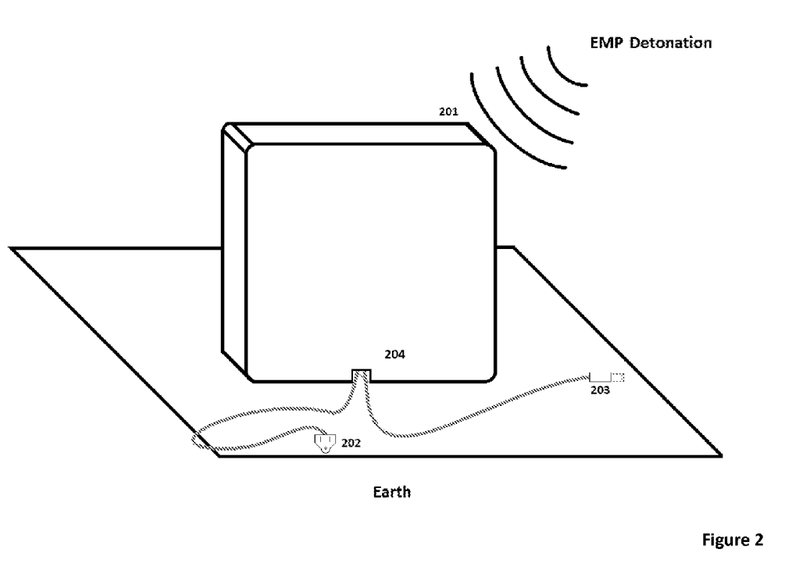
FIG. 2 is a diagram of the EMP Protected Hard Drive showing an EMP event.

The final aspect of the EMP enclosure is the small opening for cables. The opening will be designed to only allow the power 202 and data transfer cables 203 to pass through. Keeping the size of this hole to a minimum is important for protecting the hard drive. Furthermore, it is recommended that the hole be serpentine as opposed to straight through the EMP enclosure to allow the shielding to absorb more of the energy from the EMP event. As seen in FIG. 2, the small opening in the EMP enclosure will be on the bottom of the enclosure 201. Because all EMP waves travel through the air, the EMP Protected Hard Drive can use the ground as a shield, keeping air born radiation threats out of the EMP Protected Hard Drive. EMP bombs are detonated above the earth's surface in order to get wide range of effectiveness. Some detonations occur as high as 30 miles in the air. FIG. 2 demonstrates how harmful electromagnetic waves will be unable to reach the small opening in the EMP enclosure because of the orientation of the waves. The power cable 202 and the data transfer cable 203 exit the cage substantially vertically downward. The cage is designed with an indent 204 to allow the cables to flow out smoothly, while still keeping the enclosure intact. Although the opening may have no effect on EMP Protected Hard Drive's ability to redirect electromagnetic waves, placing the opening out of the natural path of the waves it just an added precaution. Faraday cages can be designed and dependable without being completely sealed.

In one embodiment, the ports for power and data could disconnect at the EMP enclosure, allowing a steel and lead cover to block the ports when the device is not in use. Alternatively, the device could include a storage compartment enclosed in a separate faraday cage, lead, and steel for the storage of cables when the device is not in use. A door in the storage compartment would allow the cables to be removed when needed. When not needed, the entire unit, including the cables, will be enclosed.

Power Source

Electromagnetic events can lead to large voltage spikes which combine extremely elevated voltage and current over a short period of time. A voltage spike does damage by traveling through power lines, covering great distances and affecting every electronic device that is linked to the power grid. Most electronic devices are not designed to handle the levels of voltage and current that would be generated from an EMP. High voltage and excess current rushes through the wires, causing them to burn up. Semiconductors and CPU's melt quickly and easily due to their small pathways. A traditional power cord, connecting a device to the wall socket, has no defense mechanism for preventing the spike from reaching the hardware. A surge protector is commonly used to protect against energy spikes, however they can't guarantee protection against the voltage magnitudes associated with an EMP. Most, if not all, surge protectors warn users about close range lightning strikes and the possibility of damage. A high-end surge protector defends against upwards of 3000 joules. In the event of a direct lightning strike, no surge protector could defend against the millions or billions of joules involved. An energy spike from an indirect lightning strike can vary depending on distance from the source and intensity of the strike. Even an indirect strike could destroy a surge protected electronic device, such as a hard drive. In the event of an EMP attack, similar to a direct lightning strike, the power lines would feed electronic devices upwards of 50,000 volts; enough to burn through any surge protector and destroy the device. So we need to provide power to operate the disk drive and communications interface without requiring current to flow through the EMP enclosure.

Batteries and Surge Protector

Figure 1:
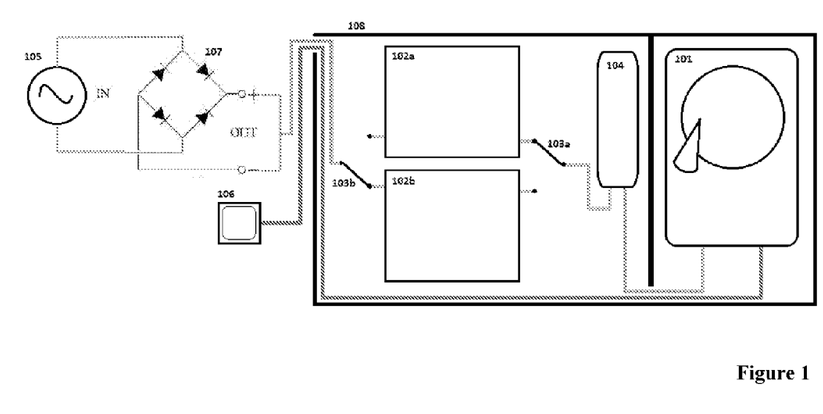
FIG. 1 is a diagram of one embodiment of the EMP Protected Hard Drive using switched batteries for power.

One embodiment of this invention uses battery rotation along with possible surge protection. As seen in FIG. 1, the EMP Protected Hard Drive would contain two batteries; one powering the device 102a and the other being charged by a power source from a wall socket 102b. The batteries are isolated by the EMP enclosure materials so that is the EMP event damages one battery, it will not impact the other battery nor the hard drive 101. When the battery powering the device is low, the batteries switch responsibilities. This will require two switches 103a and 103b. At the moment when the batteries switch responsibilities, the two switches simultaneously swap. This idea keeps the hard drive 101 disconnected from the power lines at all times. There is no direct connection between the wall AC power 105 and the hard drive 101. Any damaging energy spikes would then only affect the battery being charged. For the short period of time when neither battery is powering the hard drive, a capacitor 104 would supply sufficient energy. This capacitor 104 is in direct line between the batteries and the hard drive 101. This allows it to be charged and discharged when applicable.

The choice of battery is important because of the sealed EMP enclosure. Standard lead acid batteries off-gas hydrogen, creating a potential explosive situation within the enclosure. A preferable technology involves Nickel Metal Hydride technology, which does not off-gas explosive gases during charging. However, any number of battery technologies could be used without deviating from this invention.

The power system begins with the AC power 105 coming in from the power lines to the home or office. The AC power then continues on from the wall socket to an AC to DC convertor 107. The convertor is necessary for charging the DC batteries. The convertor powers the charging battery 102b. The powering battery 102a is powering the capacitor 104 and the hard drive 101.

The switches may require features that help defend against a jump of electricity from the one battery to the other. A large energy spike can lead to electric discharge capable of jumping from one conductive material to another, from the charging battery 102b to the powering battery 102a. In the event of an EMP event, the electricity may jump from one battery to another. If this occurred the hard drive 101 would be at risk of damage. This jump would be most likely to occur at the location of the switches where conductive materials are exposed. Keeping distance and nonconductive materials between the switches could help defend against jumps. Because of the concern for power jumps, the switches should be mechanically toggled using non-conductive rods, perhaps driven by electromagnets.

For instance, the switches could be tri-state switches, where each switch 103a or 103b could be connected to battery 102a or battery 102b or to neither battery. This could use an algorithm for switching where the power line side switch 103b would go to a state where neither battery is connected. Then the hard drive line side switch 103a would go to a neither state. Then the power line side switch 103b would switch to the discharged battery. Then, once the charged battery is clearly isolated from the power line 105, the drive side switch 103a would switch to the charged battery. This keeps the hard drive 101 isolated from the power line 105. The capacitor 104 powers the hard drive 101 during the transition.

Alternatively, the two batteries could be connected in series rather than in parallel. In this design, the first battery is switched either in a charging state, connected outside of the EMP enclosure, or it is in a discharge state, where it charges a second battery inside of the EMP enclosure. The second battery is always connected to, and always powers, the hard drive. In this design, there is no need for the capacitor to power the drive during the battery switch. The first battery in this design is in a portion of the EMP enclosure where it is isolated both from the outside environment and from the portion of the EMP enclosure that contains the hard drive. Thus the damage from an EMP pulse will be limited to the first battery should the EMP event occur while charging the first battery. If the EMP even occurs during the discharge state, there is no electrical connection to either battery.

Fiber Optic Power/Power-Over-Fiber

Another way to power to the EMP Protected Hard Drive is through the use of Fiber Optics. Fiber Optic cables are flexible fibers made of extruded glass or plastic. These cables function as a light pipes, transmitting light between the two ends of a cable. Glass and plastic are nonconductive materials and therefor can't carry electricity. This removes the threat of large amounts of energy flooding the power cable and destroying a device. This also means the device will be able to collect power from a light source through the use of a solar cell type device.

This process is commonly known as Power-over-Fiber (PoF). Although the method has not reached mass commercial development, the technology has been confirmed. The system has been created by a laser generating light through a fiber optic cable that is picked up by a photovoltaic sensor that converts the light into electricity. Photovoltaic is a method for converting light radiation into direct current. The direct conversion occurs without any moving parts or emissions. It simply has a solar cell made of this photovoltaic material and converts light to electricity. The technology is designed for situations where a spark, short circuit, or magnetic interference would prove dangerous or damaging. PoF can be found in pacemakers, gasoline sensors, cellphones, etc. Although this technology is slightly unfamiliar, its current position is reason enough to believe it could be a great option in powering and protecting the EMP Protected Hard Drive.

According to the RP Photonics Encyclopedia, for short-range transmission, laser diodes emitting around 750-850 nm can be used in combination with GaAs-based photovoltaic cells i.e., a semiconductor device based on a material such as gallium arsenide, indium phosphide, or indium gallium arsenide. The power efficiency of a photovoltaic cell can easily be around 40-50%, i.e. significantly higher than for a normal solar cell, because the photon energy of the light is well matched to the bandgap of the photovoltaic cell. The electrical-to-electrical efficiency can then be of the order of 20-30% for systems with a short fiber. Optical losses in the fiber, mostly due to scattering, limit the transmission distance and power efficiency of the system.

Figure 4:
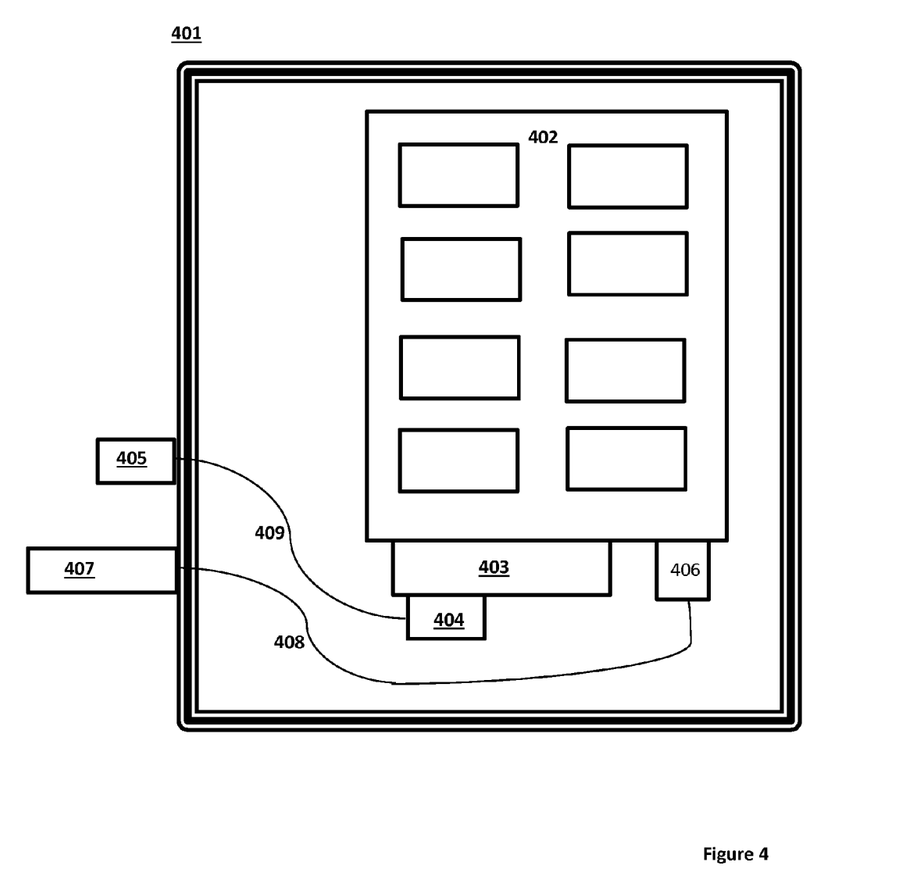
FIG. 4 is a diagram of the EMP Protected Hard Drive using Solid State Hard Drive technology and Power over Fiber.

In one aspect of the present invention, as can be seen in FIG. 4, the power over fiber system is designed so that the laser diode 407 is outside of the EMP shielding structure 401 and the photovoltaic cell 406 is inside of the EMP shielding structure 401. A short fiber optic cable 408 passes through the EMP shielding structure 401 along a serpentine path. The serpentine path of the fiber optic cable 408 is designed to limit the energy that can get directly through small hole in the EMP shielding structure 401 should an EMP event occur. The laser diode 407 will be directly coupled to the fiber optic cable 408 so that no light or energy can enter the fiber optic cable 408 with the exception of that which is generated by the laser diode 407.

The photovoltaic cell 406 could power a battery or a capacitor or could directly power the hard drive 402, or the power from the photovoltaic cell 406 could power the hard drive 402 and recharge the battery at the same time. By incorporating a battery in this design, a means is provided to operate the hard drive 402 for a period of time after an EMP event even if the laser diode 407 is destroyed by the EMP event. While it is preferable to find a laser diode capable of producing enough wattage to power the hard drive, we envision that some implementations will include a number of laser diodes simultaneously transmitting light energy to one of more photovoltaic cells over one or more fiber optic cables. For example, the JDS Uniphase PPM-500-K is a photonic power module kit capable of delivering up to 500 milliwatt of electrically isolated power, more than enough power for a solid state hard drive.

Mechanical Power Supply

Figure 5:
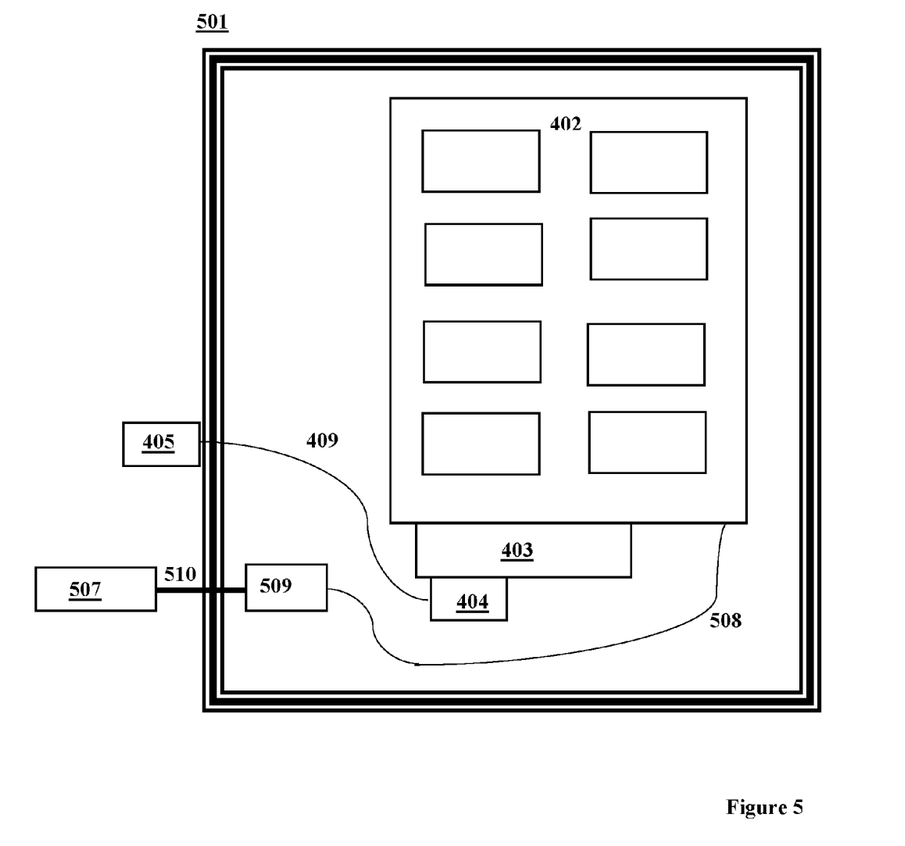
FIG. 5 is a diagram of the EMP Protected Hard Drive using Solid State Hard Drive technology and mechanical power transfer.

Another way to power to the EMP Protected Hard Drive is through the use of mechanical energy transferred through EMP shielding structure 401 on a Teflon rod 510 (or any other non-conductive material such as plastic, glass, wood, etc.). In this embodiment, the AC wall power outside of EMP shielding structure 401 is used to drive an electric motor 507 that spins the Teflon rod 510. The Teflon rod 510 goes through EMP shielding structure 401 and is connected to a generator 509 on the inside of EMP shielding structure 401. As the motor 507 spins the Teflon rod 510, the generator 509 converts this rotational energy into DC power (on wire 508) to supply power inside of EMP shielding structure 401 for the hard drive 402 and the communications electronics. In one embodiment, the generator 509 maintains a charge on a battery that is used to power the hard drive 402 and the communications circuitry.

Data Transfer

In order for the EMP Protected Hard Drive to be usable and safe at all times, data transmission from the hard drive to computer/processor cannot be a conductive material (i.e. cannot use electrical current through the EMP enclosure). This point to point communication channel has traditionally been formed with copper wire. Developing more rapidly in recent years is the use of fiber optics for data transfer. This option supplies many of the same benefits as listed above about Power-over-Fiber. Fiber Optic cables are made from glass and therefor would not absorb any effects of an EMP event.

Fiber Optic cables 106 also have the added benefit of being faster at data transfer than copper wire. Over recent years, many internet and service providers have begun to switch to fiber optic systems. Its long range and high frequency capabilities have proven to allow more data through their system and at faster rates. Being able to offer customers speeds up to a gigabyte per second it a huge selling point. The EMP Hard Drive could also benefit from these speeds, transfer data between the hard drive and the processor quickly.

In one implementation of the current invention, a Corning USB3 Optical Cable 106 passes through the EMP shielding structure along a serpentine path. The serpentine path of the fiber optic cable is designed to limit the energy that can get directly through small hole in the EMP shielding structure should an EMP event occur. One end of the Optical Cable is connected to the hard drive either directly or through a circuit board that converts USB to the interface needed by the hard drive. The other end of the Optical Cable is mounted on the exterior of the EMP shielding so that it can be connected to a standard USB cable for interface with a computer.

Alternatively, data could be transmitted by infrared through a small hole in the EMP enclosure or through a light pipe.

In another embodiment, data could be transmitted wirelessly using standard cellular protocols, WiFI or Bluetooth by sending an antenna through the EMP enclosure.

The Hard Drive

The EMP Protected Hard Drive could have the option for either the traditional Hard Disk Drive (HDD) or the Solid State Hard Drive (SSHD). The HDD typically has higher storage capacity and is cheaper, while the SSHD has flash memory that is faster and more compact with no moving parts. Left exposed, both hard drives have their vulnerabilities to EMPs. A HDD may destroy the writing and reading components along with corrupting the data. A Hard Drive is also more vulnerable to data corruption due to the magnetic fields associated with an electromagnetic pulse effect on the magnetic media. Both situations depend on the magnitude and type of EMP event. Either way the EMP Protected Hard Drive is protected by a multilayer faraday cage and energy spike proof power source that do almost all of the shielding.

In the preferred embodiment, as seen in FIG. 4, we envision the use of a SSHD 402 due to temperature and ventilation requirements on HDD devices. A standard HDD uses 3-6 watts or more. This energy needs to be dissipated within the EMP enclosure or it must be vented to the outside. Venting creates passages so that the impact of an EMP event could get inside of the EMP enclosure, damaging the data or the device. Alternatively, the EMP enclosure around a HDD could be large enough for the heat from the HDD to dissipate within the space. However, this makes the EMP Hard Drive much larger than a SSHD device.

A SSHD 402 uses a very small amount of energy, as low as 0.045 watt for a Samsung MZ-7TE250BW, generating much less heat than a HDD device. Furthermore, since the SSHD device 402 contains no mechanical parts, it is capable of operating at much high temperatures than a HDD device. This allows a design in a small space without concern about thermal damage.

Since a SSHD device uses only 45 milliwatt, readily available laser diodes 407 can be used to transfer power into the EMP enclosure 401. The higher power of a HDD could require a less common laser diode or a multiple laser diodes to transfer the 3-6 watts of energy required to run the HDD.

In FIG. 4, an EMP enclosure 401 has two fiber optic cables 408 and 409 going through the enclosure. Power is transmitted by using a JDS Uniphase PPM-500-K power-over-fiber kit 406, 407, 408. Light pipe 408 delivers power to the SSHD 402 through light sent by a laser diode 405. This light is sent via the light pipe 408 to a photovoltaic cell 406 that converts the light into the power required to run the SSHD 402, perhaps a Samsung MZ-7TE250BW. Data is sent to and from the SSHD 402 using a Corning USB 3 Optical cable 409. Optical cable 409 has two USB interfaces, a female interface 405 outside of the EMP enclosure 401 and a male USB interface 404 inside of the EMP enclosure 401 and connected to the USB to SSHD circuitry 403.

The foregoing devices and operations, including their implementation, will be familiar to, and understood by, those having ordinary skill in the art.

The above description of the embodiments, alternative embodiments, and specific examples, are given by way of illustration and should not be viewed as limiting. Further, many changes and modifications within the scope of the present embodiments may be made without departing from the spirit thereof, and the present invention includes such changes and modifications.

The invention claimed is:

1. A storage device incorporating protections from electromagnetic pulses, the storage device comprising:
    storage media,
    a storage media controller coupled to the storage media,
    a communications interface coupled to the storage media controller using a first connection through an EMP enclosure, wherein the first connection transmits data, without a flow of current, through the first connection in the EMP enclosure,
    a power supply coupled to the storage controller and the communications interface using a second connection through the EMP enclosure, wherein the second connection transmits power, without a flow of current, through the second connection in the EMP enclosure,
    the EMP enclosure encompassing the storage media, the storage media controller, the communications interface, and the power supply, the EMP enclosure comprised of materials to block electromagnetic pulses.

2. The storage device of claim 1 wherein the power supply converts photons into power.

3. The storage device of claim 2 wherein the power supply uses power over fiber.

4. The storage device of claim 1 wherein the power supply is a generator driven mechanically through the EMP enclosure.

5. The storage device of claim 1 wherein the power supply is a battery.

6. The storage device of claim 1 wherein the communications interface is a fiber optics interface.

7. The storage device of claim 1 wherein the communications interface is an infra-red interface.

8. The storage device of claim 1 wherein the storage media is a solid state drive.

9. The storage device of claim 1 wherein the storage media is a hard drive.

10. The storage device of claim 1 wherein the EMP enclosure includes a faraday cage.

11. The storage device of claim 1 wherein the EMP enclosure includes a steel enclosure.

12. A method of preventing electromagnetic pulse damage to a storage media, the method comprising the steps of:
    protecting the storage media from electromagnetic pulses by enclosing the storage media, a power supply and a communications interface within an EMP enclosure,
    transferring data to and from the storage media through a communications media that does not use a flow of current through the EMP enclosure,
    powering the storage media and the communications interface with the power supply, by transferring power through the EMP enclosure to the power supply without using a flow of current through the EMP enclosure.

13. The method of claim 12 wherein the power supply receives photons through the EMP enclosure.

14. The method of claim 12 wherein the power supply receives mechanical energy through the EMP enclosure.

15. The method of claim 12 wherein the communications media is a fiber optics cable.

16. The method of claim 12 wherein the communications media is an infra-red interface.

17. The method of claim 12 wherein the storage media is a solid state drive.

18. The method of preventing electromagnetic pulse damage to a storage media of claim 12 wherein the storage media is a hard drive.

19. The method of preventing electromagnetic pulse damage to a storage media of claim 12 wherein the EMP enclosure includes a faraday cage.

20. The method of preventing electromagnetic pulse damage to a storage media of claim 12 wherein the EMP enclosure includes a steel enclosure.

* * * * *